United States Patent [19]

Griffith et al.

[11] Patent Number: 4,864,723

[45] Date of Patent: Sep. 12, 1989

[54] ELECTRICAL CIRCUIT MODIFICATION METHOD

[75] Inventors: Louis E. Griffith, Hampstead; Peter R. Ebner, Hollis, both of N.H.

[73] Assignee: Preleg, Inc., Nashua, N.H.

[21] Appl. No.: 196,877

[22] Filed: May 19, 1988

Related U.S. Application Data

[63] Continuation of Ser. No. 880,688, Jul. 1, 1986, abandoned, which is a continuation-in-part of Ser. No. 759,467, Jul. 26, 1985, abandoned.

[51] Int. Cl.$^4$ .......................... H01K 3/10; H05K 3/02
[52] U.S. Cl. ........................................ 29/850; 29/846
[58] Field of Search .......................... 29/842, 846, 850

[56] References Cited

U.S. PATENT DOCUMENTS

| | | | |
|---|---|---|---|
| D. 218,275 | 8/1970 | Knowles . | |
| 1,450,576 | 4/1923 | Bennett . | |
| 2,174,230 | 9/1939 | Shangle | 113/111 |
| 2,349,952 | 4/1939 | Fuller | 174/121 |
| 2,911,328 | 11/1959 | Goldsmith | 117/218 |
| 3,239,598 | 3/1966 | Olson et al. | 174/120 |
| 3,267,254 | 8/1966 | Weller et al. | 219/242 |
| 3,353,263 | 11/1967 | Helms | 29/850 X |
| 3,408,453 | 10/1968 | Shelton | 174/68.5 |
| 3,412,354 | 11/1968 | Sattler | 336/205 |
| 3,646,572 | 2/1970 | Burr | 174/68.5 |
| 3,673,681 | 7/1972 | Steranko | 29/624 |
| 3,674,602 | 7/1972 | Keogh et al. | 156/380 |
| 3,674,914 | 7/1972 | Burr | 156/166 X |
| 3,676,814 | 7/1972 | Trunzo et al. | 336/205 |
| 3,875,368 | 4/1975 | Biewald | 219/214 |
| 3,981,076 | 9/1976 | Nicolas | 29/836 |
| 4,097,684 | 6/1978 | Burr | 174/68.5 |
| 4,130,676 | 12/1978 | Ichiyanagi et al. | 427/358 |
| 4,208,571 | 6/1980 | Moumaneix et al. | 219/227 |
| 4,219,927 | 9/1980 | Fukutomi et al. | 29/850 |
| 4,294,008 | 10/1981 | Pollack | 29/850 X |
| 4,337,573 | 7/1982 | Nicholas et al. | 228/33 X |
| 4,389,457 | 6/1983 | Pauze et al. | 428/379 |
| 4,403,410 | 9/1983 | Robinson | 29/830 |
| 4,415,116 | 11/1983 | Norton | 228/51 X |
| 4,447,797 | 5/1984 | Saunders et al. | 336/205 |
| 4,450,623 | 5/1984 | Burr | 29/850 |
| 4,528,746 | 7/1985 | Yoshimura | 29/743 |
| 4,620,889 | 11/1986 | Winter et al. | 156/166 |
| 4,693,778 | 9/1987 | Swiggett et al. | 29/850 X |
| 4,711,026 | 12/1987 | Swiggett et al. | 29/850 |

FOREIGN PATENT DOCUMENTS

| | | | |
|---|---|---|---|
| 237212 | 11/1970 | Australia | 51/190 |
| 3408338 | 9/1985 | Fed. Rep. of Germany . | |
| 3408345 | 9/1985 | Fed. Rep. of Germany . | |
| 748982 | 4/1970 | France | 156/579 |
| 2304247 | 10/1976 | France . | |
| 1504252 | 3/1978 | United Kingdom . | |

OTHER PUBLICATIONS

Hot Solder Iron Resistance Test.
Soldering Technology—a decade of developments—C. J. Thwaite—International Metals Review, 1984, vol. 29, No. 2.
Methods and Tools for Solder Joint Removal, Walgren Insulation/Circuits, Aug. 1976.
Hand on Manual Soldering, Sylvester, Insulation/Circuits, Oct. 1975.
Multiwire®, Kollmorgen Corp.—information brochure, 1984.
Multiwire®, Kollmorgen Corp.—information brochure.
Hysol® 7901 information sheet.

*Primary Examiner*—Nicholas P. Godici
*Assistant Examiner*—Carmine Cuda
*Attorney, Agent, or Firm*—Curtis, Morris & Safford

[57] ABSTRACT

Wire for repairing or changing circuit elements such as printed circuits has heat-resistant insulation surrounded by a hot-melt adhesive. The wire is attached to the surfaces of printed circuit boards easily by applying a hot iron to the adhesive layer on the wire and melting the adhesive which then adheres to the board surface. The hot iron has a tip with a groove in it so that when the iron tip is pressed onto the wire, the tip embraces the wire to melt the adhesive quickly and to make the bond relatively quickly. The coating is applied by passing insulated wire vertically through a length of molten adhesive and then through a die. A cleaner/holder device is used for cleaning the tip of a hot iron used for melting adhesive, or a soldering iron, and for holding the hot iron when it is not in use. The preferred cleaner is anti-combustion treated absorbent cotton string wound on a spool which is mounted in the holder, or adhesive tape with a soft clutch backing. A fresh cleaning surface can be provided simply by rotating the spool, or unwinding a layer of the cleaning material and removing it.

25 Claims, 7 Drawing Sheets

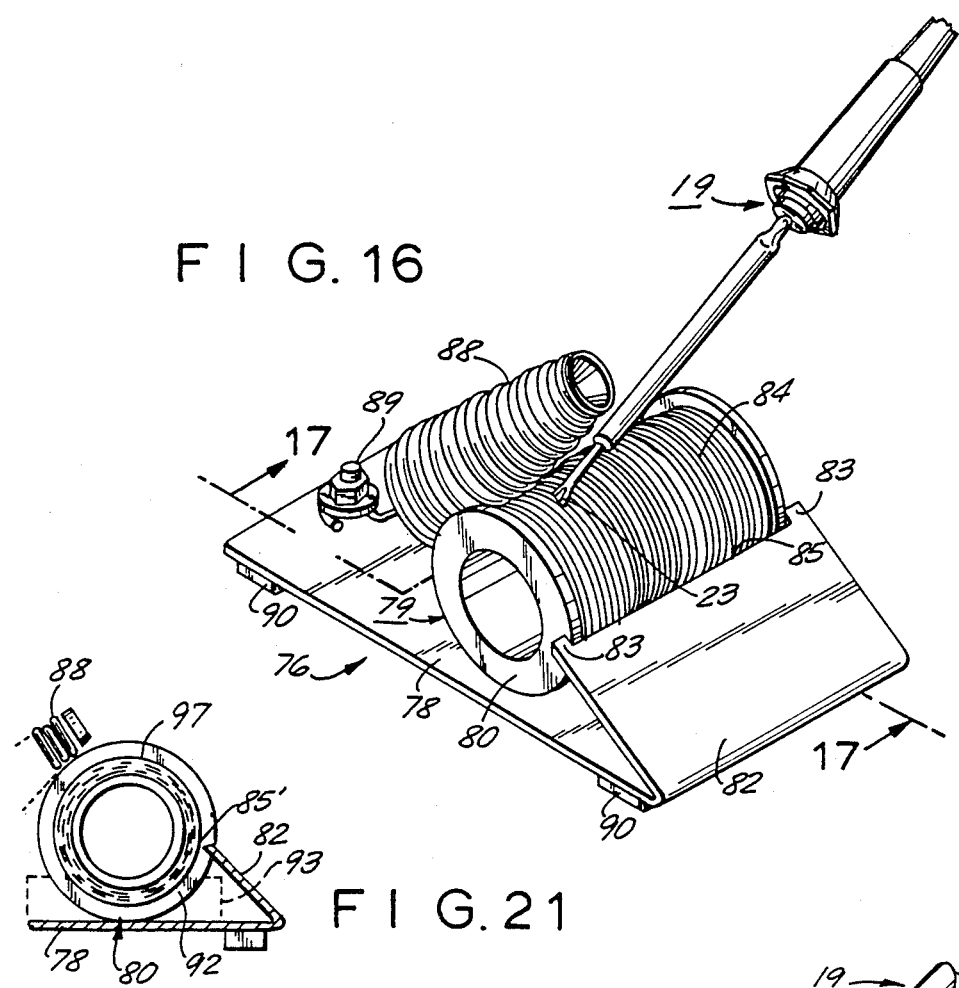
FIG. 16
FIG. 21
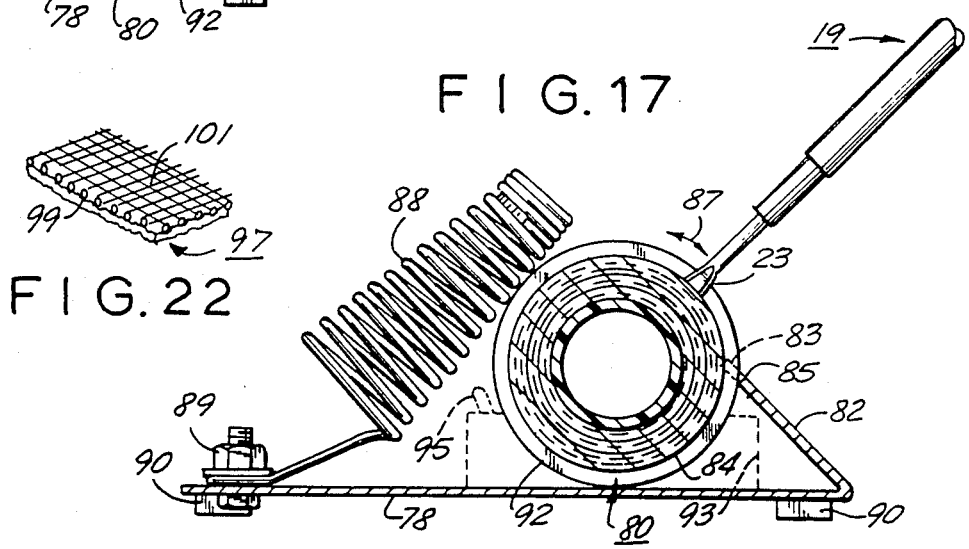
FIG. 17
FIG. 22

ELECTRICAL CIRCUIT MODIFICATION METHOD

This application is a continuation of application Ser. No. 880,688, filed July 1, 1986 now abandoned which is a continuation-in-part of U.S. Pat. Application Ser. No. 759,467, filed July 26, 1985, now abandoned.

FIELD OF THE INVENTION

This invention relates to methods and apparatus for making corrections and changes in electrical circuits, and particularly to printed circuit boards, through the use of jumper wires, and to the structure and fabrication of the jumper wires. This invention also relates to devices and methods for holding and cleaning hot irons used in circuit fabrication or correction.

BACKGROUND OF THE INVENTION

Printed circuit boards often are found to contain errors, or require changes due to improvements in the circuits. The circuit board changes can be made by changing the art work for the board. However, this can be very expensive. Even if the changes are fairly extensive, often it is far less costly to hand-apply jumper wires in selected locations on the board. The new connections usually are made by inserting one bare end of an insulated jumper wire into a plated hole in the board, gluing the wire onto the surface of the board along a predetermined path, and inserting the other bare end into another plated hole. Then the board is passed through a wave soldering bath which solders all of the wires and component terminals in the plated holes. Alternatively, the terminals can be hand-soldered in place.

The board surfaces onto which the jumper wires are glued most often are coatings of "solder resist" materials, usually epoxy resins. The adhesives used to glue the jumper wires onto those surfaces vary; they include silicone rubber, acrylics, epoxies, and hot-melt adhesives. The adhesives are applied manually. The prior methods of applying adhesives suffer various disadvantages. For example, the wire usually must be held in place for a substantial amount of time to allow for sufficient curing or cooling of the adhesive to properly secure the wire to the printed circuit board. Usually this is a time-consuming process and may result in a poor bond if sufficient cooling or curing time is not allocated.

Another disadvantage of prior methods is that they are messy. This increases labor costs for the process due to increased set-up and clean-up time. Also, the prior methods usually are awkward to use. This further reduces worker productivity.

When epoxy adhesives are used, the two components are mixed in a batch which is kept near the work station where it is to be used. The material hardens into a useless mass if it is not used promptly; that is, the material does not have a very long "pot life". This is wasteful, costly and requires additional labor to mix new batches relatively frequently.

Some prior adhesives are toxic or give off toxic fumes when used, thus posing a health hazard to workers and necessitating the use of special safety procedures and/or equipment.

In accordance with one feature of the present invention, a heating tool is used to melt a hot-melt adhesive on a wire to adhere the wire to circuit element surfaces. This creates the new problem that the heating tool should be cleaned frequently in order to prevent the build-up of hardened adhesive on it. Cloths can be used for this purpose, but they are relatively slow and inefficient to use since they must be replaced frequently as the surface becomes covered with waste adhesive, and since a clean area on the cloth may take a considerable length of time to find. Also, the cloth may smolder or burn due to contact with the iron.

A cleaning problem similar to that experienced with hot-melt adhesive melting irons is found in using soldering irons. Wet sponges usually are used to wipe the excess solder and flux materials off of the iron tip. However, the sponge dries out and becomes charred and must be replaced relatively frequently.

A problem with some jumper wires which have thin coatings of high-temperature-resistant plastics such as polytetrafluoroethylene (e.g. DuPont "Teflon") for insulation is that they are not very resistant to cuts and abrasion. This endangers the integrity of the circuits in which they are used.

OBJECTS OF THE INVENTION

It is an object of the present invention to provide an improved method for securing jumper wires to circuit elements such as printed circuit boards which overcome the aforementioned problems and disadvantages. Another object is to provide an improved wire for use in such a method, and to provide an improved circuit element such as a printed circuit board utilizing the wire and the method.

It is a more specific object of this invention to provide such a method and wire which are relatively easy and fast to use, and with which circuit corrections or changes are made relatively efficiently at a moderate cost.

Another object of the present invention is to provide a device for use in cleaning the tip of a hot iron used to melt or apply circuit-fabrication material such as adhesives or solder, in which cleaning can be done relatively rapidly and easily, and in which a fresh cleaning surface can be obtained with similar rapidity and ease. It is a more specific object to provide a relatively simple and inexpensive cleaning device which also serves as a holder for the hot iron. A still further object is to provide such a device and cleaning material for use in the device in which combustion of the cleaning material during cleaning is retarded.

A further object of this invention is to provide a method and apparatus for producing the improved wire of the invention.

SUMMARY OF THE INVENTION

In accordance with one aspect of the present invention, wire to be secured to a circuit element such as a printed circuit board comprises an electrical conductor with an inner coating of insulation and outer coating of adhesive, preferably a hot-melt adhesive.

In one embodiment of the invention, the wire can be pre-cut to desired lengths and the insulation stripped at the ends to form pre-fabricated jumper wires. The pre-fabricated jumpers also can be pre-bent to a desired shape, thus making them ready to use.

In use, the adhesive-coated wire is electrically connected at its ends to terminals of the circuit element, and the wire is secured to the surface of the element by simply heating and pressing the adhesive coating against the surface.

The adhesive coating advantageously serves the dual purpose of providing a quantity of adhesive convenient to every spot along the length of the wire, while also serving as a protective coating for the relatively thin insulation in the wire.

Preferably, the adhesive is heated and pressed against the surface by means of a heating device such as a hot iron with a tip shaped to straddle the wire and press it against the surface of the circuit element.

The adhesive coating and iron tip are dimensioned so that only a relatively small amount of adhesive is melted by the hot iron, thereby enabling the adhesive to be melted relatively quickly and harden with similar speed.

In straddling the wire, the hot iron preferably contacts the surface of board to heat it locally. To this end, the hot iron tip, in its preferred form, has an elongated groove which is deeper than the diameter of the insulator layer but shallower than the diameter of the adhesive layer.

It is preferred that the melting temperature of the adhesive be relatively high so that there will be a minimum amount of softening of the adhesive bonds of the jumper wires to the printed circuit board when it is passed through a wave soldering device which heats the board significantly. It also is preferred to use a relatively high iron temperature so as to ensure good adhesion of the adhesive to most of the epoxies and other materials used to coat printed circuit boards.

The electrical insulation on the wire should be able to withstand the temperature of the heating device without melting. Therefore, it is preferred that the insulation be made of a high-temperature-resistant material such as polytetrafluoroethylene (PTFE), (e.g., DuPont "Teflon"). Alternatively, an irradiated, cross-linked polymer such as irradiated cross-linked polyvinyl chloride can be used where conditions are not the most severe.

The adhesive coating is applied to the PTFE-coated wire by heating a container of the adhesive to a fluid state, and passing the wire through the fluid material and a die. Preferably, the surface of the PTFE insulation is etched to improve adhesion of the adhesive coating, and the wire is moved vertically through the fluid container to ensure uniformity in the thickness of the adhesive coating.

The hot iron tip cleaning problems are solved, in accordance with the present invention, by providing a cleaning element with an easily-renewable cleaning surface. The surface can be renewed by simply removing one layer of a layered cleaning element to expose a fresh layer.

The cleaning element preferable for use with the grooved hot iron tip is one composed of plural strands of fibrous material, preferably of a size to fit into the groove of the iron. Preferably, the cleaning material is wound on a form such as a spool. Ordinary cotton string comprises an excellent and inexpensive stranded fibrous material. It is simply wound on the spool, and unwound to expose a fresh layer when needed.

Alternatively, especially for cleaning soldering irons, the cleaning surface comprises a roll of cloth tape with a pressure-sensitive adhesive backing which is simply peeled off of the roll and torn off to expose a fresh surface.

A combination iron holder and iron cleaner also is provided.

If it is desired to dampen the cleaning material with water, a water reservoir is provided in which to store water in contact with the cleaning material.

The cleaning material is treated with a combustion retardant to prevent the material from burning or smoldering due to contact with a hot iron.

Various other objects, advantages, and features of the present invention will be described in or will become readily apparent from the following detailed description and drawings.

BRIEF DESCRIPTION OF THE DRAWINGS

In the drawings:

FIG. 16 is a perspective view of one embodiment of a device for holding and cleaning a heating device tip in accordance with the present invention;

FIG. 17 is a cross sectional view taken along line 17—17 of FIG. 16;

FIG. 21 is a cross-sectional view of another embodiment of the holder/cleaner device; and The depth of the groove 41 preferably is between 65% and 85% of the total diameter of the wire 10 with the adhesive coating intact, and is about equal to the diameter of the insulated wire plus the thickness of the adhesive coating. The groove 41 forms ridges or legs 44 (FIG. 7) with bottom edges 43 (FIG. 6).

Figure 4:
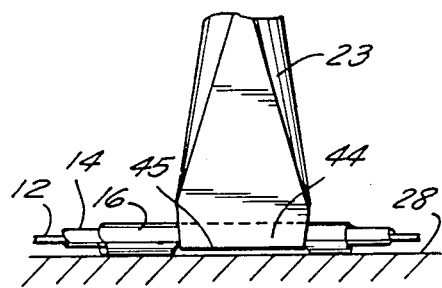
FIG. 4 is an enlarged side elevation view of the tip of the heating device of FIG. 2 being brought into contact with the wire of FIG. 1.
Figure 5:
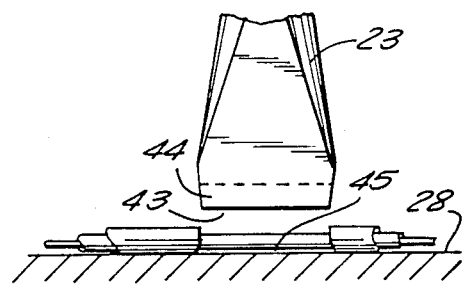
FIG. 5 is a side elevation view similar to FIG. 4 after the tip of the heating device has been removed from the wire.
Figure 7:
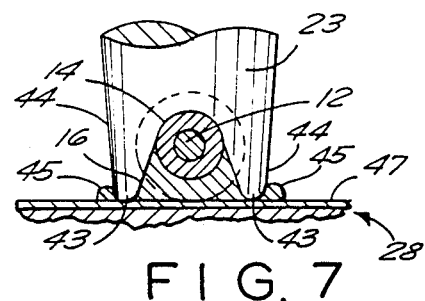
FIG. 7 is a cross-sectional view of the tip of the heating device of FIG. 6 shown as it melts the adhesive which coats the electrical wire of FIG. 1.

When the hot iron tip 23 has melted through the adhesive 16, the bottom edges of the ridges 44 abut against the epoxy "solder-resist" coating 47 on the printed circuit board 28, as it is shown in FIGS. 4 and 7. This creates some heating of the board material so as to enhance adhesion. The tip 23 is shown in FIG. 7 with melted adhesive which has spread outwardly from the ridges 44 as indicated at 45. This spreading action is believed to enhance rapid cooling and hardening of the adhesive.

The preferred range of temperatures for the tip 23, when using Hysol XPA adhesive is from around 550° F. to 650° F. A temperature of approximately 600° F. is preferred.

The iron need be applied for only one or two seconds, in most cases. One reason for such speed, it is believed, is that the mass of the melted adhesive is small relative to the mass usually used with prior methods. The coating of adhesive is just thick enough to ensure that the spaces between the ridges 44 and the wire 10 are filled, or a little more than filled, with adhesive. Another reason, it is believed, is that the bond extends over a relatively long section of the wire and thus covers a substantial area so that the holding power of the adhesive quickly becomes adequate to secure the wire to the board without being held down so that the iron can be removed to allow the adhesive to further cool and harden rapidly.

Figure 10:
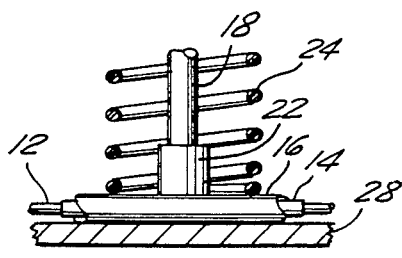
FIG. 10 is an enlarged side elevation view of an alternative embodiment of the tip of the heating device of the invention being brought into contact with the wire of FIG. 1.
Figure 11:
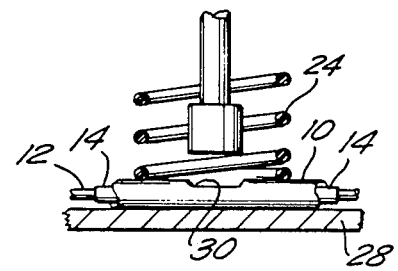
FIG. 11 is a side elevation view similar to that of FIG. 9 showing the tip of FIG. 10 after it has been pressed against the wire of FIG. 1 and then removed.

An alternative tip 22 for the heating device is shown in FIGS. 10 and 11. The tip 22 is cylindrical in shape and is surrounded by a coil spring 24 which can be used to press the wire against the printed circuit board before, during, and after melting of the hot-melt adhesive in the unusual circumstances in which the foregoing arrangement does not give fast enough cooling of the adhesive. The spring 24 is fixed at one end to the heating element 26 (FIG. 2) of the heating device 19. At its opposite end, the spring extends beyond the end of the tip 2.

As it is shown in FIG. 11, the spring 24 presses the wire 10 downwardly against the printed circuit board 28. As the heating device 19 is pushed downwardly further, the spring 24 is further compressed so that the tip 22 is pressed against the wire to heat a local region of the adhesive layer 16.

After the adhesive has been melted, the heating device 19 is lifted slightly from the wire 10, as shown in FIG. 11, so that the tip 22 is lifted from the wire, but the spring 24 continues to hold the wire against the printed circuit board 28. This allows time for cooling and setting of the adhesive 16 without allowing the wire to spring upwardly and pull free of the circuit board 28.

Figure 8:
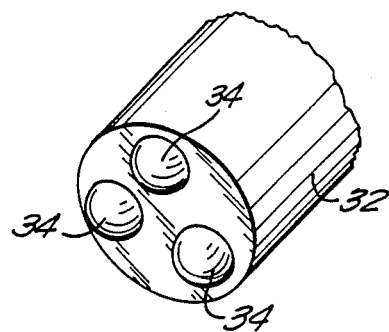
FIG. 8 is an enlarged perspective view of an alternative embodiment of the tip of the heating device of the invention.
Figure 9:
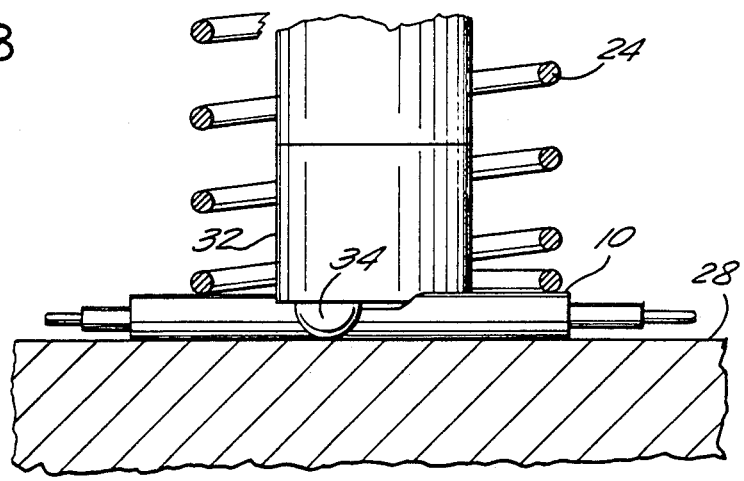
FIG. 9 is an enlarged side elevation view of the tip of FIG. 8 being brought into contact with the wire of FIG. 1.

Another tip 32 of the heating device 19 is shown in FIG. 8. The tip 32 includes three hemispherical feet 34. As it is shown in FIG. 9, these feet allow the tip 32 to straddle the wire 10 as it is pressed against the printed circuit board 28. The feet also serve to position the tip properly over the wire 10 during the bonding process.

Figure 12:
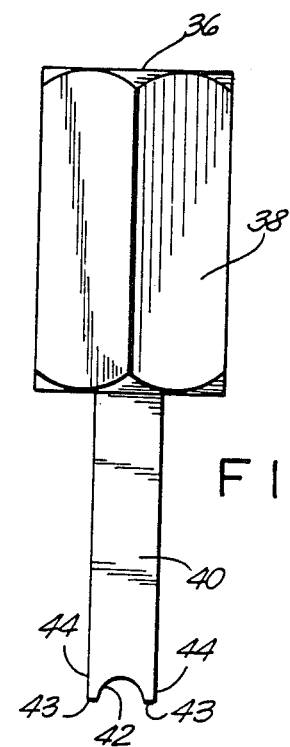
FIG. 12 is an enlarged view of an alternative embodiment of the tip of the heating device of the invention.
Figure 13:
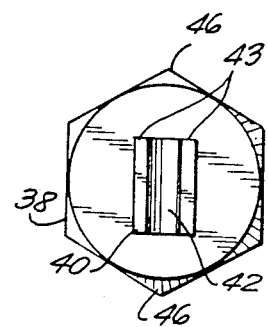
FIG. 13 is a bottom plan view of the device shown in FIG. 12.
Figure 14:
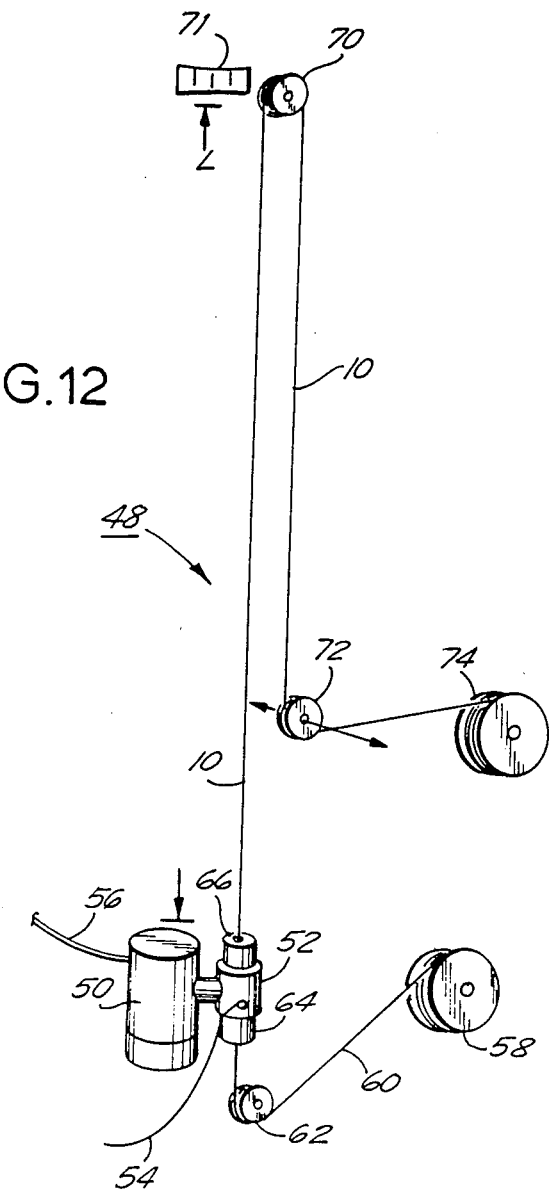
FIG. 14 is a schematic perspective of the equipment used for coating insulated wire with a hot-melt adhesive outer coating.

Another tip 40 for the heating device 19 is shown in FIGS. 12 and 13. The tip 40 is substantially the same as the tip 23 described above. One end (not shown) has threads and is threaded into a hole in a hexagonal body member 38 which is, in turn, threaded into the heating element of the device.

The tip 40 has a concave, cylindrical groove in it. The groove 42 separates elongated ridges 44 which serve as legs which straddle the wire 10 as the tip is pressed against the printed circuit board 28. As with the preferred embodiment of FIGS. 6 and 7, the tip 40 straddles the wire 10 and presses against the printed circuit board 28 to locally heat the board for a better bond. The spring 24 is not required. The groove 42 is aligned with two corners of the hexagonal member 38. This assists in the orientation of the groove 42 with the wire by giving the user an alignment reference plane.

C. Adhesive Material

The temperature of the usual wave solder bath is around 500° F. or a little higher. In the usual wave soldering process the bath metal briefly touches only the bottom side of the printed circuit board —the one without components attached. However, portions of the upper side of the board sometimes reach temperatures over 300° F. Therefore, in order to prevent the jumper wire from coming loose during wave soldering, the melting temperature of the adhesive should be as high as possible, but at least 300° F. to 350° F. Accordingly, the two preferred adhesives for use in this invention are those having the highest melting points and having the ability to adhere to glass-filled epoxy printed circuit board surfaces and epoxy solder-resist coatings.

Figure 15:
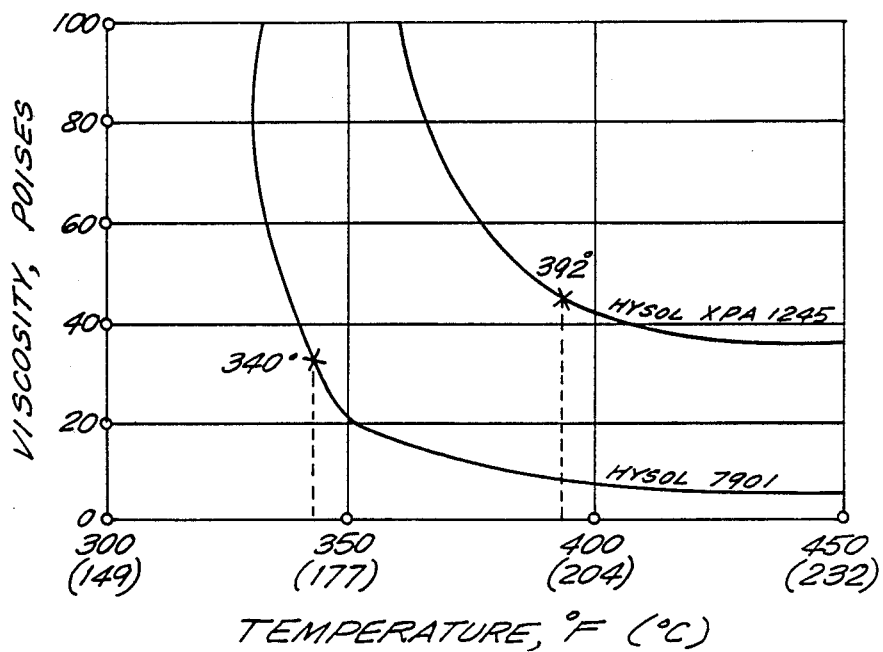
FIG. 15 shows graphs plotting the viscosity versus temperature for two hot-melt adhesives used to coat the wire of the invention.

The approximate viscosity-temperature curves of the preferred Hysol adhesives used in the present invention are illustrated in FIG. 15. Both are seen to be advantageous in that the viscosity is relatively high at temperatures just below the "melting point" temperatures. The melting point of the Hysol 7901 adhesive, as determined by the standard "ring and ball" test specified in ASTM E28-67, is around 340° F. The melting point of the XPA 1245 adhesive, using the same procedures, is approximately 392° F. The XPA 1245 material is preferred because of its higher melting point and its higher viscosity at temperatures above the melting point. However, adhesives with even higher melting points, say, up to 550° F., are even better.

The maximum melting point temperature of the adhesive is not particularly critical. However, it has been found that an iron tip temperature of at least 500° to 650° should be used in order to obtain an adequate chemical reaction between the adhesive and certain epoxy resins used as solder-resist materials to ensure a good bond. Although higher iron temperatures can be used, this can cause problems. Therefore, a melting point below 550° F. is preferred.

It should be pointed out that the viscosity-temperature curves of FIG. 15 are only estimates, and that the actual values may differ significantly from those shown. Therefore, the "melting point" for each material, which is fairly well defined, should be used as the most reliable measure of the holding power of the adhesive at elevated temperatures.

D. Adhesive Coating Process

Figure 1:
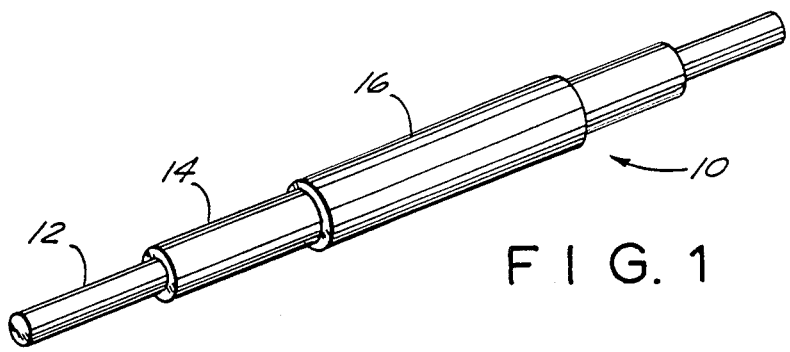
FIG. 1 is a perspective view of an insulated electrical wire embodying the present invention.

FIG. 12 shows machine 48 used for coating the wire 10 of FIG. 1 with hot-melt adhesive. The adhesive-free wire 60 preferably has PTFE-insulation which is etched in a caustic chemical solution to promote the adhesion of the adhesive layer 6 to the insulator layer 14. Any of several caustic chemical solutions known in the art may be used for the etching process.

FIG. 22 is a perspective view of a material used in the device of FIG. 21.

GENERAL DESCRIPTION

FIG. 1 shows the special jumper wire 10 of the present invention. The wire 10 includes an inner conductor 12, a coating of insulation 14, and a coating of hot-melt adhesive 16 over the insulation 14.

Figure 2:
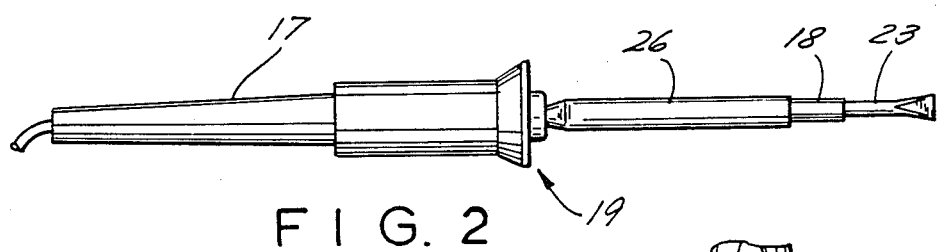
FIG. 2 is a wide elevation view of a heating device for use with the wire of FIG. 1.
Figure 6:
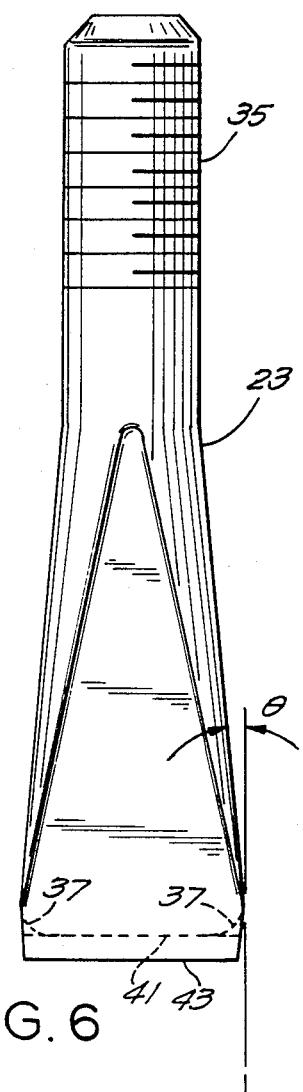
FIGS. 6, 6A and 6B are, respectively, enlarged side elevation, bottom plan, and end elevation views of the preferred embodiment of the tip of the heating device of FIG. 2.

FIG. 2 shows an electrical heating iron 19, like a soldering iron, with a handle 17, a receptacle 18, an electrical heating element 26, and a specially-shaped tip 23. As it is shown in FIGS. 6 and 7, the tip 23 is flattened to give it a shape like a screwdriver blade. The lower edge of the tip has an elongated groove 41 (FIGS. 6–6B) to fit over the outside of the wire 10 so that the iron tip embraces the wire, and the sides 44 of the tip on opposite sides of the groove 41 straddle the wire as shown in FIG. 7 when the tip is pressed down on top of the wire.

Figure 3:
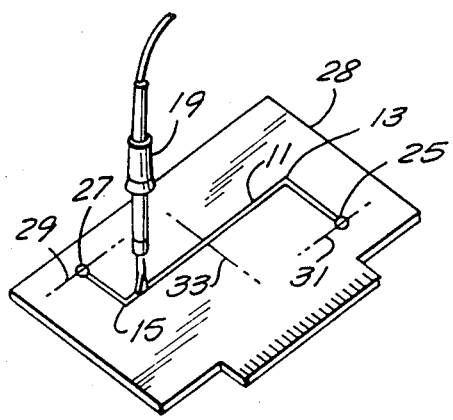
FIG. 3 is a schematic perspective view illustrating of the use of the wire of FIG. 1 and the heating device of FIG. 2 to repair a printed circuit board.

In FIG. 3, a jumper wire 11 having the structure of the wire 10 in FIG. 1 and the heating device 19 of FIG. 2 are shown in use for repairing or changing a printed circuit board 28.

First, if the jumper wire 11 has not been pre-cut to the proper length, one end of the wire 10 is stripped of insulation, bent over, and inserted into a plated hole 25 in the board 28. Then the heated tip 23 of the device 19 is pressed down onto the wire 10 near the hole 25, held there for a second or two, and released. The wire then is bent to form corners 13 and 15, and the hot iron 19 is used again in the same way at appropriate points along the wire to secure it to the surface of the board 28. Then, when the correct length of the jumper wire has been determined, the wire is cut, and the remaining end is stripped of insulation, bent over and inserted into another plated hole 27. Then, the jumper wire ends are soldered into the holes 25 and 27 by the use of a soldering iron or gun, or preferably, in a wave soldering device which solders all of the junctions on the board 28 simultaneously.

If the jumper wire 11 has been pre-cut to the proper length and its ends stripped before use, the stripping and cutting steps described above are not necessary. Also, the bends of the wire at 13, 15 and at the ends of the jumper wire can be pre-formed by the use of bending dies. Then the user need only apply and attach the wire to the board.

Portions of printed conductors on the board 28 are shown at 29, 31 and 33. The conductors 29 and 31 make electrical contact with the jumper wire 11 at the plated holes 25 and 27. However, the jumper wire 11 crosses over the conductor 33 and others like it without making electrical contact, both because of the insulation on the wire, and because of the insulating epoxy solder-resist coating over at least some of the conductors on the board.

The iron tip 23 heats and very quickly melts the hot-melt adhesive 16, which flows in the manner shown in FIG. 7, and adheres to the surface of the printed circuit board 28. Some of the adhesive cools quickly to form a bond. Then, after being held in place briefly, the iron tip 23 is removed and, the remaining melted adhesive cools, forming a solid adhesive bond between the wire and the board surface.

The jumper wire process and equipment described above are quick and easy to use, and have other advantages which will be discussed in the detailed description which follows.

DETAILED DESCRIPTION

A. Wire Structure

The wire 10 shown in FIG. 1 includes an inner conductor 12 which, for example, may be a 0.010 inch diameter copper wire. It may have a very thin (0.0002–0.0005 inch) electroplated coating of silver on the outer surface.

In order for the insulation 14 to be able to withstand the high temperatures it will be subjected to during the use of this invention, the insulation is preferably is a thermoset, heat resistant polymer material. Preferred materials are heat-resistant materials such as polytetrafluorethylene (PTFE) and may include irradiated cross-linked polyvinylchloride and polyethylene. Such an insulation layer 14 is typically about 0.005 inch thick, and in the preferred embodiment its outer surface is etched chemically, e.g. by a caustic chemical solution, in order to promote adhesion between it and the adhesive 16. The thickness of insulation layer 14 is preferred to be approximately 45% to 55% of the diameter of conductor 12.

The hot-melt adhesive layer 16 should be just thick enough to supply enough melted adhesive to make a good bond. For example, an adhesive thickness of about 0.005 inch thick, that is, one approximately equal to the thickness of the insulation layer 14, is preferred. For reasons discussed below, a preferable hot-melt adhesive is "Hysol" brand type XPA-1245 or type 7901. Both materials are polyamides sold by the Dexter Corporation.

B. Heating Device

The heating device 19 illustrated in FIG. 2 may be a conventional soldering iron but with the typical pointed soldering tip replaced by the special tip 23.

The device of FIG. 2 may be used to help route the wire by pressing the hot tip against the wire near a desired bend to fasten the wire to the board at the point of contact. As the iron is used to hold the wire down, it is bent at the contact point of the iron tip to the board 28 to change the direction of the wire. This is desirable because bending and fastening of the wire are done in the same step.

The preferred tip 23 is illustrated in FIGS. 4 through 7. As it is shown in FIG. 6, the tip preferably has screw threads 35 at one end and is threaded into a threaded hole in the receptacle 18 (FIG. 2). Therefore, the tip 23 may be used in conjunction with many different types of irons such as soldering irons which use replaceable tips. The tip 23 is elongated and relatively thin at its lower end so as to facilitate accessibility to the printed circuit board 28 in areas congested with many components and/or conductors.

Figure 6B:
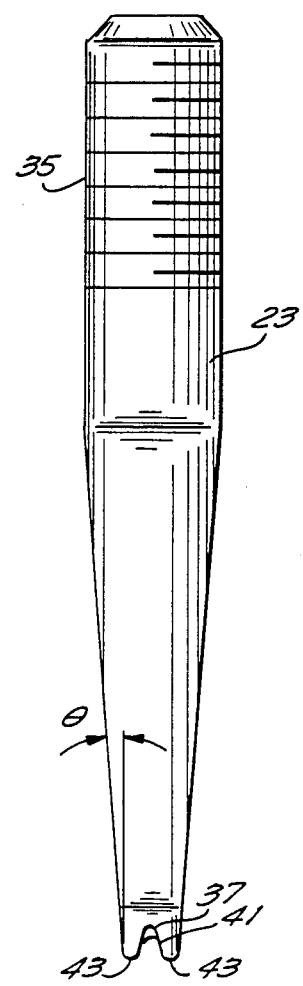
Figure 6A:
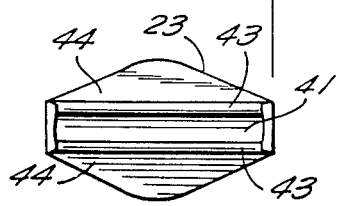

The tip 23 is cylindrical at its upper threaded end 35, and tapers outwardly in the dimension shown in FIG. 6, and tapers inwardly in the dimension shown in FIG. 6B. The angle 0 of taper is approximately four degrees.

As it is shown in FIG. 6, the metal at each end of the groove 41 is cut away to form rounded edges 37. This enables one to tilt the tip 23 sideways while using one of the rounded edges 37 as a pivot, thus holding the wire down and allowing one end of the melted adhesive area to cool and harden faster than if the iron tip were held in contact with the wire over the full width of one tip. The rounded edges 37 prevent the metal from digging into the insulation 14 on the wire.

The coating machine 48 consists essentially of a take-up reel 74 driven by a variable speed motor (not shown), a supply reel 58, a melting pot 50 with an adhesive supply reservoir 52 and a die 66 through which the adhesive-free wire 60 passes in a vertical direction.

The adhesive is placed in pellet form in the melting pot 50 and is melted by an electric heater which is part of the melting pot assembly. The melted adhesive is stored in the adhesive supply reservoir 52 at a constant temperature of around 400° F., which is monitored by means of thermocouple 54. Reservoir 52 also serves as the coating chamber. Nitrogen gas is fed into the melting pot 50 through a tube 56 to minimize the oxidation of the molten adhesive.

The adhesive-free electrical wire 60 is mounted on the supply reel 58 and routed over a guide pulley 62 to the adhesive supply reservoir 52. The wire 60 passes upwardly through a guide 64 into the reservoir 52 where it is coated with molten adhesive. The wire 60 then exits the reservoir 52 through the die 66 which is provided to determine the thickness of the adhesive layer on the wire.

The orifice size of the die 66 is adjustable to vary the thickness of the adhesive and to accept various sizes of wire.

After coating, the wire 10 travels a distance sufficient to allow the adhesive to harden. The distance L depends on the thickness of the adhesive, the speed of the wire, and the ambient air temperature, among other things. The wire 10 then is routed over a precision pulley 70. The precision pulley 70 is integral with a counter mechanism 71 which counts the number of revolutions of the pulley 70 in order to measure the length of wire coated.

The wire 10 then passes over a level-winding pulley 72 and is level-wound on the take-up reel 74. The reel 74 is driven at a variable speed and pulls the wire 10 through the coating machine 48 at a relatively constant speed.

By moving the adhesive-free wire 60 vertically rather than horizontally through the die 66, unevenness of the adhesive coating due to the effects of gravity are avoided. The result is an even adhesive coating economically applied.

E. Tip Cleaning

A device 76 for cleaning the tip of the heated iron 19 is shown in FIGS. 16 and 17. The device 76 also serves as a holder for the heating iron.

The cleaner/holder device 76 has a frame made of aluminum or other suitable metal. The frame comprises a single sheet of metal forming a base plate 78 and an upwardly-bent end portion 82, a cleaning device 79, and an iron holder 88 secured to the base plate at one end by means of a bolt and washer combination 89. The cleaning device 79 includes a form or spool 80 into which is wound several layers of an elongated fibrous material such as cotton string.

The spool 80 is wedged between the tapered helical spring forming the iron holder 88 and the upper edge 85 of the end-portion 82 of the base to releasably hold the spool in place so that the iron tip 23 can be wiped across the cleaning surface 84 formed by the string wound on the spool 80.

The spool 80 has a cylindrical core and flanges 92 to hold the string wound in it in place. The spool 80 can be an ordinary fishing-line spool, for example. It is held by tabs 83 at the ends of the upper edge 85 of the end portion 82.

The cotton string preferably is treated with a combustion-retardant solution. A suitable solution consists of 2% borax and 2% boric acid by weight dissolved in water.

Figure 20:
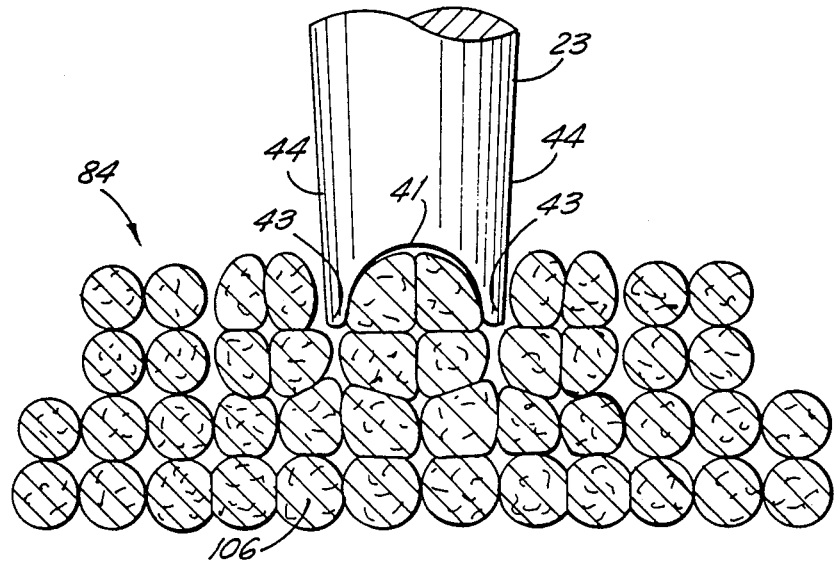
FIG. 20 is a partially schematic cross-sectional view of the cleaning action of the cleaning device of the invention.

The cleaning process is shown in FIGS. 17 and 20, as well as FIG. 16. The tip 23 is moved over the cleaning surface 84 in a direction 87 (FIG. 17) in which the groove 41 is aligned with the strands 106 of the string as shown in FIG. 20, so as to allow the strands 106 to enter the groove 41 of the tip 23 to clean out any residual adhesive. The bottom edges 43 of the ridges 44 and the outside surfaces of the ridges are also cleaned by adjacent strands of string.

Of course, the surface 84 also can be used to clean other adhesive melting iron tips such as thoses illustrated in FIGS. 8 through 13, regardless of the shape of the tip.

In accordance with the present invention, a fresh cleaning surface can be exposed by means of one of two alternative methods. First, the spool 80 can be rotated a little to expose a clean portion of the surface 84. When there is no more clean area, the second method can be used; namely, unwinding the string on the spool until a fresh layer of string has been exposed. Either method is simple and quick.

Other cleaning surfaces can be used. For example, FIG. 21 shows a cleaning surface formed by a roll 97 of adhesive tape which has a relatively soft, absorbent cloth backing. When a clean wiping surface is needed, the user can either rotate the spool 80, or the user can peel off all or part of one layer of tape 97. The upper front edge 85' of the base portion is sharpened and/or serrated to facilitate cutting off a length of tape.

FIG. 22 is an enlarged section of the tape 97 of FIG. 21. The adhesive material is shown at 99 and the soft cloth backing at 101. A tape of the type described is so-called "athletic" tape which is used to wrap ankles, knees and other parts of athlete's bodies for support purposes. Since the adhesive tape 97 needs the adhesive primarily to hold the roll together without unwinding, tape with a relatively weak adhesive may be used. The cloth 101 should be treated with fire-retardant materials of the type described above.

It is believed that the embodiment of the invention shown in FIGS. 21 and 22 is especially suitable for cleaning the tips of soldering irons. If the adhesive melting iron of FIGS. 2-7 is to be cleaned using the tape form of cleaning surface, the groove in the iron tip can be cleaned especially well if corduroy cloth is used for the tape 97. The ridges of the cloth preferably extend circumferentially around the roll, and the tip 23 can be wiped against the cloth in the direction shown by arrow 87 in FIG. 17 to clean out the groove in the tip.

It is believed by many that a cleaning surface for soldering irons should be wet in order to do the best cleaning. Accordingly, a water reservoir 93 is mounted on the base plate 78 (FIG. 17) for the roll of string 80 to be immersed in. The string will stay wet all the way around as water is absorbed from the reservoir 93 into all fibers of the string. The same kind of reservoir 93 also can be used with the tape of FIG. 21. As desired, the fire-retardant chemicals can be added to the water in the reservoir 93, if desired, rather than soaking the string before the spool of string is mounted on the base plate 78.

If desired, water in the reservoir 93 can be replenished automatically by use of any of a multitude of known water replenishment devices, such as those used to water pets, chickens, etc. Water can be added by such means through an inlet tube 95.

Figure 18:
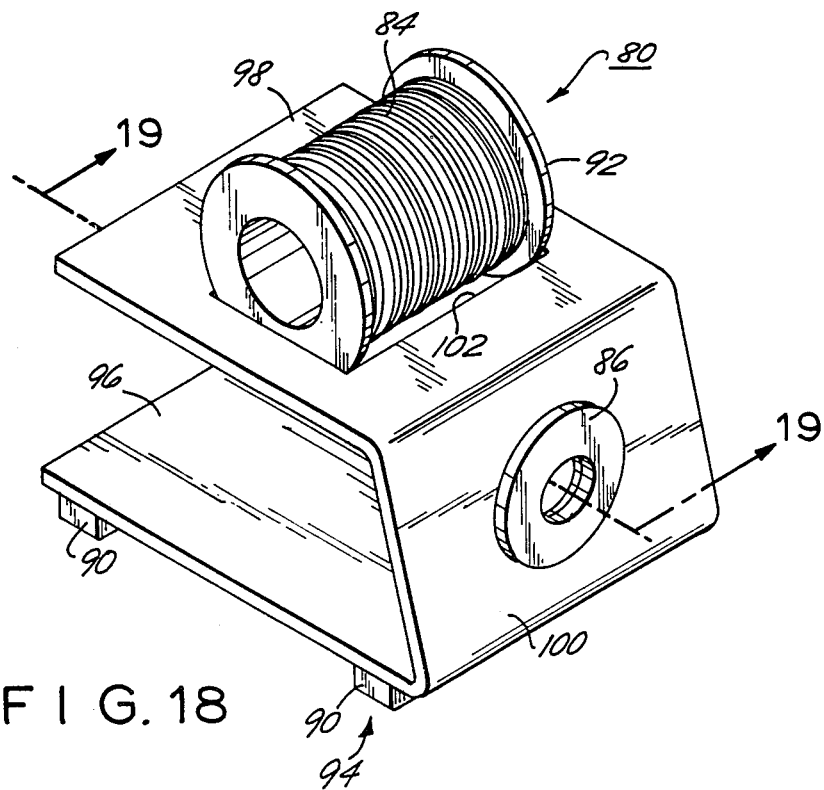
FIG. 18 is a perspective view of an alternative heating device holder/cleaner device.
Figure 19:
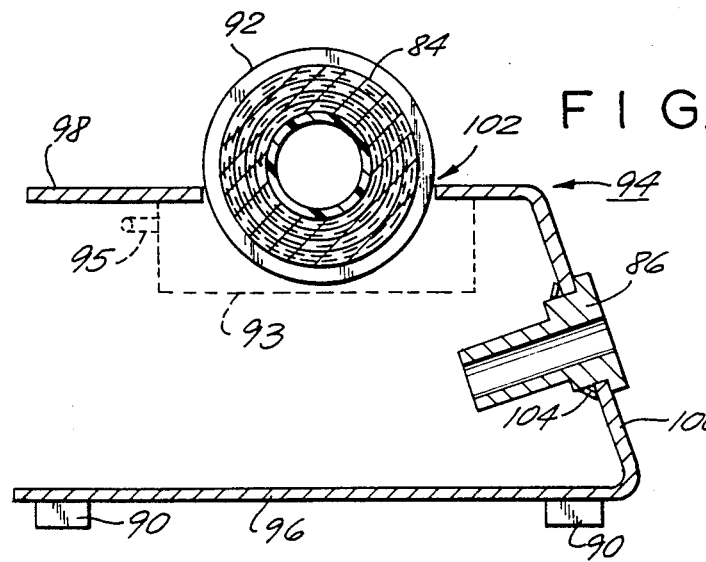
FIG. 19 is a cross sectional view taken along line 19—19 of FIG. 18.

An improved cleaner/holder device 94 is illustrated in FIGS. 18 and 19. The device 94 has a frame consisting of a single aluminum sheet punched and bent to form a generally U-shaped structure. The frame has a lower base portion 96, an angled front portion 100, and a top portion 98. The top portion 98 has a rectangular hole 102 which is slightly wider than the length of the spool 80, but whose other dimension is slightly smaller than the diameter of the flanges 92 of the spool 80. The weight of the spool forces the edges of the flanges 92 against the edges of the hole 102. This acts as a brake to hold the spool in place while an iron tip is being wiped across its surface 84.

The front portion 100 of the frame has a circular hole into which an elongated cylindrical bushing 86 is fitted. Bushing 86 is constructed of a heat-resistant material and, as it is shown in FIG. 19, is secured in place by circular retaining clip 104. Bushing 86 serves as the holding device to hold the heating device 19 when it is not in use.

As with the embodiments shown in FIGS. 16, 17, 21 and 22, a water reservoir 93 can be provided to keep the cleaning surface damp. Also, the tape form of the cleaning surface shown in FIGS. 21 and 22 also can be used with the holder shown in FIGS. 18 and 19.

Each of the embodiments shown in FIGS. 16-21 has rubber feet 19 on the base plate to keep the device from slipping on a surface on which it rests while a hot iron is being pushed against the cleaning spool 80.

While the present invention has been particularly shown and described with reference to preferred embodiments, various changes and modifications in form and details may be made without departing from the spirit and scope of the invention. It is intended that the appended claims be interpreted as including the foregoing as well as various other changes and modifications.

We claim:

1. A method of modifying a completed electrical circuit on an electrical circuit member, said method comprising the steps of providing a wire comprising a length of conductor having an electrical insulation layer and an adhesive layer surrounding the insulation layer, electrically connecting the ends of the conductor to said circuit member, said adhesive being normally inactive and being activated by the application of heat thereto, and pressing a tip of a heat applicator against said wire to hold said wire against said board while heating said adhesive by contact with said tip to fasten said wire to said circuit member.

2. A method as in claim 1 wherein said insulator layer is made of polytetrafluorethylene.

3. A method as claimed in claim 1 including the step of electrically connecting the ends of the conductor terminals on said printed circuit board by soldering.

4. A method as in claim 1 wherein the adhesive layer is a hot-melt adhesive.

5. A method as claimed in claim 4 including the step of heating said adhesive layer by the application of said heat applicator having a temperature of from approximately 550° F. to approximately 650° F.

6. A method as in claim 1 in which said heat applicator has two laterally-spaced apart portions to contact said wire, and including the step of removing one of said portions from contact with said wire while leaving the other portion in contact with said wire so as to hold said wire against said board until the heated adhesive near said one portion has cooled, and then removing said other portion from contact with said wire.

7. A method as claimed in claim 6 wherein said heat applicator tip is a heated tip which is said one portion and said heat applicator includes a spring element which is said other portion of said heat applicator, and in which the spring element presses against the wire as the heated tip is moved toward and into contact with the wire and continues to press said wire against the board as the heated tip is pulled away from the wire.

8. A method as in claim 6 in which said heat applicator tip is an elongated tip, said portions being spaced-apart portions on said tip, said applicator being tapered towards said tip.

9. A method as in claim 8 including the step of tilting said heat applicator to keep said one portion in contact with said wire while lifting said other portion.

10. A method as in claim 8 in which said heat applicator has a handle, an elongated groove in said tip and beveled edges at the ends of said groove, said one portion being at one of said ends and the other portion being at the other of said ends, and including the step of tilting said applicator about said one edge.

11. A method as in claim 1 in which said heat applicator tip straddles the wire to conduct heat to and compress the adhesive when it is pressed against said wire.

12. A method as claimed in claim 11 wherein said tip comprises an elongated groove, the depth of the groove being greater than the diameter of the insulator layer and less than the diameter of the adhesive layer.

13. A circuit wiring method comprising the steps of:
providing an electrical circuit member bearing a plurality of pre-existing conductors in a pre-determined pattern formed by automated equipment,
providing an additional conductor bearing insulation with inactive hot-melt adhesive completely surrounding said conductor and said insulation,
applying said conductor to and manually holding said conductor at a desired location on said circuit member without the use of said automated equipment,
activating said hot-melt adhesive by heating it while holding it at one or more selected locations by contacting the adhesive with heated tip to cause said additional conductor to adhere to said circuit member, and
electrically connecting said additional conductor to said pre-existing conductors.

14. A method as in claim 13 in which said adhesive has a melting point higher than approximately 300° F.

15. A method as in claim 14 in which said melting point is between approximately 300° F. and 550° F.

16. A method as in claim 14 in which said melting point is between approximately 340° F. and 400° F.

17. A method of modifying printed circuit boards, said method comprising the steps of providing a printed circuit board bearing multiple electrically conductive printed circuit paths formed by a printed circuit board fabrication method,
said board having a coating of epoxy resin solder-resist material,
providing an elongated conductor with a coating surrounding said conductor, said coating including an inner-most portion of insulating material and an outer portion of hot-melt adhesive material, placing said conductor on said printed circuit board, applying a heated tool to said adhesive material at a selected location and contacting said solder resist coating with said tool, the temperature of said tool being between approximately 500° F. and 650° F., thus causing said conductor to adhere to said printed circuit board and electrically connecting said conductor to said printed circuit paths.

18. A method as in claim 17 in which said conductor has at least one uninsulated end, extending said end into one of a plurality of conductive holes extending through said board, and said electrically connecting step comprises passing said board through a hot solder bath with the solder contacting the surface of said board opposite the surface bearing said conductor, the melting point of said adhesive being sufficient to maintain the adherence of said conductor to said board despite heating thereof by said hot solder bath.

19. A method as in claim 18 which the melting point of said adhesive is higher than approximately 300° F.

20. A method of manually attaching heat-meltable adhesive coated insulated wire to electrical circuit-bearing circuit boards by use of a tool having heating tip means dependent upon the angular orientation of said tool relative to said wire to heat and melt said adhesive, said method comprising the steps of holding said tool against said wire in a first angular orientation so as to hold said wire against said board and heat and melt said adhesive, changing said tool to a second angular orientation while holding said tool against said wire so as to allow at least a portion of the melted adhesive to cool, removing said tool from contact with said wire after said adhesive has cooled and electrically connecting said wire to said circuit on said board.

21. A method as in claim 20 in which said heating tip means includes an elongated heating tip which contacts a substantial length of said wire in said first angular orientation, and contacts a substantially smaller portion in said second angular orientation.

22. A method of attaching heat-responsive adhesive-coated insulated wires to a circuit-bearing substrate, said method comprising the steps of pressing and holding a heated element tip against one of said wire to activate said adhesive and hold said wire against said substrate, lifting a portion of said heated element tip away from said wire while another portion continues holding said wire against said substrate to allow a portion of said adhesive to cool and harden before completely releasing said wire and electrically connecting said wire to said circuit on said board.

23. A method as in claim 22 in which said heating element tip has recess into which said wire fits and including the step of fitting said wire into said recess when pressing said wire against said substrate.

24. A method as in claim 22 in which said heating element tip extends for a substantial distance along said wire when applied thereto, said lifting step comprising pivoting said element to lift one portion of said element while making contact and continuing to press said wire at the point of pivot distant from said one portion.

25. A method as in claim 24 in which said heating element tip has a recess into which said wire fits, said recess being elongated and having a beveled edge at at least one end, said point of pivot being located at said beveled edge.

* * * * *